United States Patent [19]

Weyrich et al.

[11] 3,948,693

[45] Apr. 6, 1976

[54] PROCESS FOR THE PRODUCTION OF YELLOW GLOWING GALLIUM PHOSPHIDE DIODES

[75] Inventors: Claus Weyrich, Gauting; Guenter Winstel, Ottobrunn, both of Germany

[73] Assignee: Siemens Aktiengesellschaft, Berlin & Munich, Germany

[22] Filed: July 23, 1974

[21] Appl. No.: 490,997

[30] Foreign Application Priority Data

July 27, 1973 Germany............................ 2338264

[52] U.S. Cl. ................ 148/171; 148/172; 148/173; 252/62.3 GA; 156/622; 156/624
[51] Int. Cl.² ........................................... H01L 7/38
[58] Field of Search.................. 148/171, 172, 173; 252/62.3 GA; 156/622, 624

[56] References Cited
UNITED STATES PATENTS

| | | |
|---|---|---|
| 3,603,833 | 9/1971 | Logan et al..................... 148/171 X |
| 3,669,767 | 6/1972 | Hackett et al...................... 148/171 |
| 3,689,330 | 9/1972 | Dosen et al........................... 148/171 |
| 3,703,671 | 11/1972 | Saul............................... 148/171 X |
| 3,723,177 | 3/1973 | Toyama et al................... 148/171 X |
| 3,783,825 | 1/1974 | Kobayashi et al................... 148/172 |

Primary Examiner—G. Ozaki
Attorney, Agent, or Firm—Hill, Gross, Simpson, Van Santen, Steadman, Chiara & Simpson

[57] ABSTRACT

Process for the production of yellow glowing gallium phosphide diodes by a liquid phase epitaxial process in which the substrate is covered with a gallium melt saturated with gallium phosphide, elemental tellurium, oxygen and nitrogen are injected into the melt as dopants, a first layer is grown on the substrate from the melt, and then a zinc containing layer is deposited over the first layer, and the temperatures of the layers are controlled to cause diffusion of the zinc into the first layer to a predetermined depth.

4 Claims, 1 Drawing Figure

U.S. Patent April 6, 1976 3,948,693
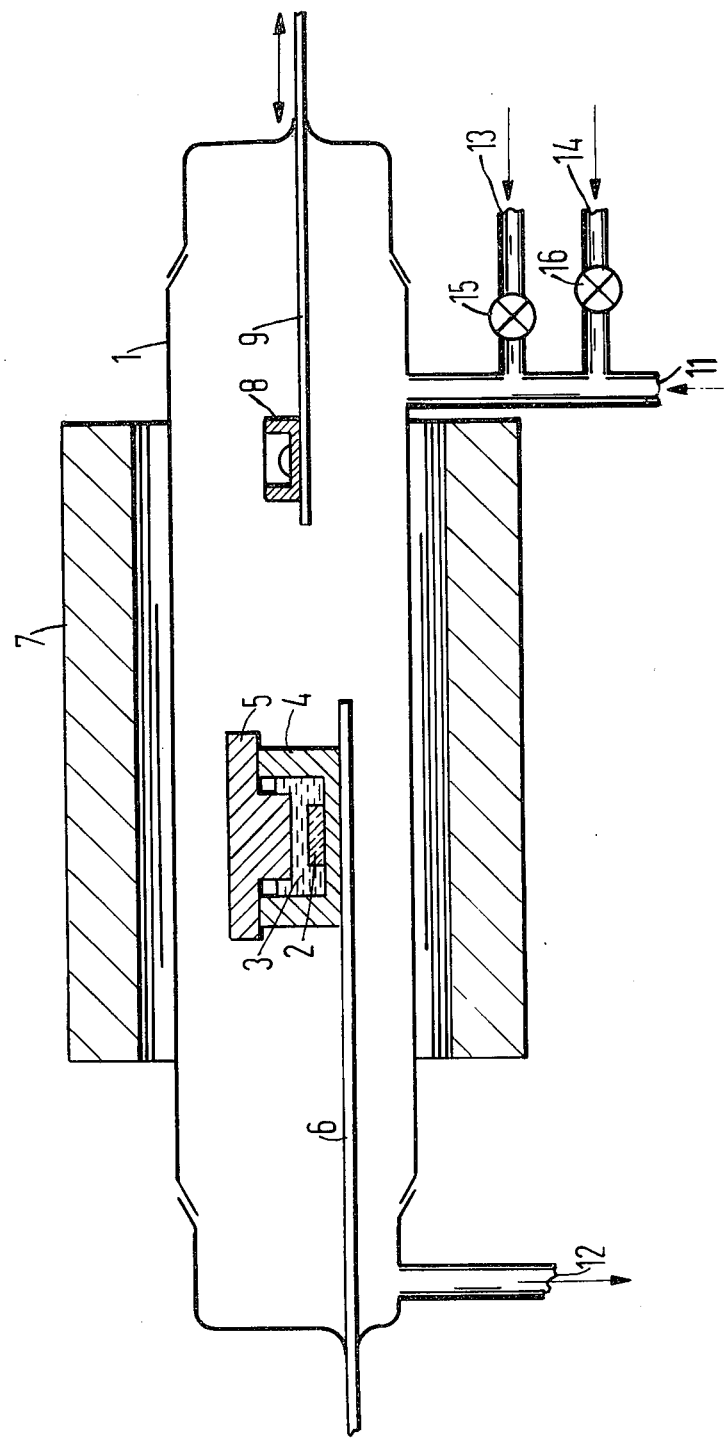

3,948,693

PROCESS FOR THE PRODUCTION OF YELLOW GLOWING GALLIUM PHOSPHIDE DIODES

BACKGROUND OF THE INVENTION

1. Field of the Invention

This invention is in the field of depositing epitaxial layers of gallium phosphide on a large area substrate utilizing controlled amounts of dopants in the first stage, followed by a second stage deposition and controlled diffusion of zinc.

2. Description of the Prior Art

It is known to produce yellow glowing luminescence diodes by mixing the radiation of closely adjacent red and green glowing luminescence diodes with appropriate intensities. It is also known to deposit a p-conducting layer, doped with zinc and oxygen on a sulfur and nitrogen doped crystal plate by cooling in a gallium melt. In this case, a red glowing luminescence radiation occurs by the recombination of electrons and holes at isoelectronic zinc oxide centers, and a green glowing radiation is formed by recombination of isoelectronic nitrogen atoms. Subjective color mixing by the eye then physiologically produces the impression of a yellow glowing luminescence diode. The production of the above-described crystal plates is, however, extremely difficult in practice.

SUMMARY OF THE INVENTION

The present invention provides a process for depositing epitaxial layers of gallium phosphide on a large area substrate wherein the operating conditions are reproducible to produce luminescence diodes with predetermined concentrations of dopants.

The process of the present invention resides in first depositing a layer on a substrate which is homogeneously doped with tellurium, oxygen and nitrogen, epitaxially growing a first layer with such dopants thereon and thereafter depositing a second layer which is doped with zinc. During the growth process of the second layer or thereafter, the layers are subjected to conditions of temperature and time such that a given proportion of the zinc diffuses out of the second layer into the first layer to a predetermined depth. It is accordingly possible by means of the process of the present invention to produce yellow glowing luminescence diodes on large area Czochralski substrates in a single epitaxial step, that is, without intermediate venting. With this process, it is possible to obtain monocrystalline semiconductor layers of a high degree of purity and a structure in which both the p- and the n-layers are composed of epitaxial material. Consequently, higher conversion efficiency is achieved in the transformation of electrical direct current energy into luminescent radiation energy.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

The single FIGURE in the drawing illustrates rather schematically an apparatus which can be used for the process of the present invention.

DESCRIPTION OF THE PREFERRED EMBODIMENTS

The epitaxy apparatus shown in the drawing has already been described in German OS 2,247,710. There is provided a reaction tube 1, the interior of the reaction tube 1 being filled with a protective gas such as argon which flows into the tube through an inlet 11 and out through a discharge outlet 12. A substrate 2 is immersed in a tellurium doped gallium melt 3 which is contained in a crucible 4, the construction of which is described in the above-mentioned German application, and which is provided with a cover 5. The crucible is mounted on a removable holder 6 in the reaction tube 1 in a predetermined position. The gallium melt 3 doped with tellurium has previously been saturated with gallium phosphide at the operating temperature. A furnace 7 heats the substrate 2 and the gallium melt to an operating temperature of about 1100°C. When the operating temperature has been reached and following a homogenization period, the dopants oxygen and nitrogen are introduced in gaseous state and in controlled quantities through inlets 13 and 14, respectively, to become part of the protective gas flow. The proportioning of the gases is carried out by means of valves 15 and 16. The nitrogen doping can be effected through the addition of ammonia gas which is pyrolitically decomposed under the conditions of operation to nitrogen and hydrogen.

The first epitaxial layer is grown at a constant concentration of oxygen and ammonia gas in the protective gas stream by cooling the gallium melt which has been saturated with gallium phosphide. The amount of tellurium added to the gallium melt, and the oxygen and nitrogen concentrations in the gas phase are such that the dopant concentrations of the individual dopants in the first epitaxial layer are preferably as follows: The tellurium concentration is in the range of 1 to $5 \times 10^{17}$ per cubic centimeter. For oxygen, the concentration is about $1 \times 10^{17}$ per cubic centimeter and for nitrogen, the concentration is approximately $1 \times 10^{18}$ to $2 \times 10^{19}$ per cubic centimeter, and preferably at about $1 \times 10^{19}$ per cubic centimeter. At a nitrogen concentration below the lower limit, the intensity of the green emissivity is too low, while at a concentration above about $1 \times 10^{20}$ an overall displacement of the emission occurs.

Following the first epitaxial layer growth and the doping of the epitaxial layer as aforesaid, a second epitaxial layer is grown with the addition of oxygen and ammonia to the protective gas atmosphere being terminated. At the same time, an evaporating dish 8 is introduced with the aid of a holder 9 into the reaction tube 1 so that metallic zinc which is contained in the evaporating dish is evaporated at approximately 800°C. The evaporating temperature is set by controlling the extent that the evaporating dish 8 is introduced within the furnace 7. The zinc diffuses into the gallium melt 3 and causes a redoping of the melt so that with further cooling, a second epitaxial layer with p-conductivity grows. During the cooling process or by means of a heat treating process at a high temperature, the zinc diffuses out of the second layer into the first epitaxial layer, so that the first layer becomes p-conductive to the depth of zinc diffusion. In the first originally n-conducting layer there is thus formed isoelectronic zinc oxide pairs which are required for light emission in the red spectral range.

Instead of using a heat treating process, the penetration depth of the zinc can also be controlled by means of an appropriate cooling rate during the growth process of the second epitaxial layer.

The quantity of zinc to be evaporated in the evaporating dish 8 is controlled such that a zinc concentration of approximately $2 \times 10^{18}$ per cubic centimeter is produced in the second epitaxial layer. The conditions of heat treating are such as to cause the zinc to penetrate into the second layer for approximately 1 to 3 microns from the growth boundary of the second layer into the first n-conducting layer.

In accordance with a further modification of the process, the simultaneous doping concentration for the tellurium, oxygen and nitrogen can be increased to the following maximum values: for tellurium approximately 1 to $2 \times 10^{18}$ per cubic centimeter, for oxygen approximately $1 \times 10^{17}$ per cubic centimeter, and for nitrogen a concentration of approximately $2 \times 10^{19}$ per cubic centimeter. At concentrations above these values, it is possible for growth faults to occur in the monocrystalline structure of the gallium phosphide host lattice which lead to reduced light yields for the luminescent radiation.

In accordance with a further development of the process, the relatively high doping concentration of nitrogen can be achieved not only by a gas phase treatment by means of ammonia gas, but by a liquid phase treatment. In this type of procedure, a given quantity of gallium nitride is introduced into the gallium melt and the melt is then homogenized at operating temperature in a sealed quartz ampoule which prevents the nitrogen from evaporating. The melt which is homogenized with gallium nitride and obtained in the above-identified manner can be used in the above example in place of the gallium melt 3. In this case, there is no ammonia gas supplied to the protective gas during the deposition of the first epitaxial layer.

It should be evident that various modifications can be made to the described embodiments without departing from the scope of the present invention.

We claim as our invention:

1. A process for the production of yellow glowing gallium phosphide diodes by a liquid phase epitaxial process which comprises covering a substrate with a tellurium doped gallium melt saturated with gallium phosphide, diffusing gaseous oxygen and nitrogen into said melt as dopants, growing a first epitaxial layer on said substrate from said melt, growing a second epitaxial layer over said first layer, injecting vaporized zinc into said second layer during the growth of said second epitaxial layer and controlling the temperature of the layers to cause diffusion of the zinc from said second into said first layer to a predetermined depth.

2. The process of claim 1 in which a protective gas atmosphere is passed over said melt and said gaseous oxygen and a gaseous nitrogen source are added to said gas atmosphere.

3. The process of claim 3 in which said nitrogen is added in the form of ammonia gas.

4. The process of claim 1 in which the concentration of nitrogen dopant is in the range from $1 \times 10^{18}$ to $2 \times 10^{19}$ per cubic centimeter.

* * * * *